United States Patent
Bailey (10) Patent No.: US 10,405,445 B1
(45) Date of Patent: Sep. 3, 2019

(54) MEDIA DOOR ASSEMBLY FOR A MARINE ELECTRONICS DEVICE

(71) Applicant: NAVICO HOLDING AS, Egersund (NO)

(72) Inventor: Paul Robert Bailey, Auckland (NZ)

(73) Assignee: NAVICO HOLDING AS, Egersund (NO)

( * ) Notice: Subject to any disclaimer, the term of this patent is extended or adjusted under 35 U.S.C. 154(b) by 0 days.

(21) Appl. No.: 16/119,019

(22) Filed: Aug. 31, 2018

(51) Int. Cl.
| | |
|---|---|
| *H05K 5/00* | (2006.01) |
| *H05K 5/03* | (2006.01) |
| *H01F 7/02* | (2006.01) |
| *H05K 5/02* | (2006.01) |

(52) U.S. Cl.
CPC .............. *H05K 5/03* (2013.01); *H01F 7/0263* (2013.01); *H05K 5/0017* (2013.01); *H05K 5/0226* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,311,017 B1* | 10/2001 | Mori | ...................... | G03B 17/08 348/81 |
| 6,396,769 B1* | 5/2002 | Polany | ...................... | H04R 1/44 367/131 |
| 7,613,386 B2* | 11/2009 | Shimamura | ............ | G03B 17/08 206/316.2 |
| 7,755,975 B2* | 7/2010 | Pettersen | .................. | H04R 1/44 367/131 |
| 8,089,757 B2* | 1/2012 | Chen | ...................... | G06F 1/1626 174/66 |
| 8,995,126 B2* | 3/2015 | Rayner | .................. | H01H 13/06 361/679.56 |
| 9,549,478 B2* | 1/2017 | Laster | .................. | H05K 5/0217 |
| 9,549,598 B2* | 1/2017 | Rayner | ................ | A45C 13/008 |
| 9,955,762 B2* | 5/2018 | Rayner | ................ | A45C 13/008 |
| 2007/0071423 A1* | 3/2007 | Fantone | ................ | G03B 17/08 396/27 |

(Continued)

OTHER PUBLICATIONS

TackleDirect; "Lowrance HDS-7 Gen3 Fishfinders", retrieved from <https://www.tackledirect.com/lowrance-hds-7-gen3-fishfinders.html> 4 pages.

(Continued)

*Primary Examiner* — Lisa Lea-Edmonds
(74) *Attorney, Agent, or Firm* — Nelson Mullins Riley & Scarborough LLP (57) ABSTRACT

A door assembly for a marine electronics device including a door defining a first end and a second end, a substantially planar surface, at least one hinge element disposed proximate the first end, and a finger recess. The finger recess is sized to enable a user to fit at least a portion of a finger therein to enable movement of the door to an open position. The door assembly also includes a deformable tab disposed at the peripheral edge of the planar surface of the door at the second end. The deformable tab fills the finger recess of the door and is movable between a resting position and a deflected position, is biased to the resting position. Movement of the deformable tab to the deflected position enables the user to move the door to the open position.

20 Claims, 5 Drawing Sheets

(56) References Cited

U.S. PATENT DOCUMENTS

| | | | |
|---|---|---|---|
| 2007/0115387 A1* | 5/2007 | Ho | A45C 11/38 |
| | | | 348/375 |
| 2007/0261978 A1* | 11/2007 | Sanderson | A45C 11/22 |
| | | | 206/320 |
| 2009/0017884 A1* | 1/2009 | Rotschild | H04M 1/18 |
| | | | 455/575.8 |
| 2010/0147737 A1* | 6/2010 | Richardson | A45C 11/00 |
| | | | 206/701 |

OTHER PUBLICATIONS

Lowrance; "HDS-5 Gen2 Lake Insight Transducer", retrieved from <https://www.amazon.com/Lowrance-HDS-5-Gen2-Insight-Transducer/dp/B006MGU2B8>, 9 pages.

FishFinderGuy; "Lowrance HDS 9 gen2 Touch Review", retrieved from <https://www.fishfinderguy.com/lowrance-hds-9-gen2-touch-review/>, 7 pages.

Alternative Offroad; "Lowrance HDS-9 Gen3 9" Touch Screen GPS, retrieved from <http://www.alternativeoffroad.com/Lowrance-HDS-9-Gen3-9-Touch-Screen-GPS_p_4089.html>, 4 pages.

* cited by examiner

MEDIA DOOR ASSEMBLY FOR A MARINE ELECTRONICS DEVICE

FIELD OF THE INVENTION

Embodiments of the present invention relate generally to marine electronics devices, and more particularly, to systems and apparatuses for a media door assembly for a marine electronics device.

BACKGROUND OF THE INVENTION

Marine electronics devices may include functionality for providing a user with sonar images, navigational displays, autopilots, among other things. In some examples, marine electronics devices, may have a non-transitory computer readable media, e.g. storage media, configured to store marine data, such as sonar data, catch data, position data, navigational charts, routes, environmental data, software applications, etc.

BRIEF SUMMARY OF THE INVENTION

In some examples, a marine electronics device, or multifunction display (MFD), may include an internal storage media, such as a hard drive. The user may connect to another computing device or the internet to change device settings, download or upload marine data, and/or install updates to device software. This process may be cumbersome, in some cases requiring removal and reinstallation of the MFD to the watercraft to complete.

In some examples, an MFD may be provided with a media port configured to receive one or more types of removable storage media, such as a universal serial bus (USB) flash drive, secure digital (SD) card, micro SD card, or the like. The user may install the removable storage media into the media port and cause the MFD to read the contents of the storage media. However, in some cases, external media ports provide a potential ingress path for water to enter the MFD, which may cause damage. As such, some media ports may include a water proof cover and/or be positioned in a manner that water ingress is significantly reduced, such as on the back or side of the MFD, in a remote location (such as an external drive under a console), or the like.

In an example embodiment, a media door assembly for an MFD provides water or debris resistance to a media port disposed on a display face of the MFD. The door assembly may include a door including a finger recess to enable a user to fit a portion of their finger therein to enable movement of the door to an open position. The door assembly may also include a deformable tab disposed such that the deformable tab fills the finger recess and provides water or debris resistance when in a resting position. The deformable tab may be moved, by the user finger, to a deflected position to allow access to the finger recess—to thereby enable opening of the door and access to the media port. As such, the deformable tab may be configured to deflect inward, outward, or both inward and outward.

In an example embodiment, the door assembly may include a sealing element disposed adjacent to the door. The sealing surface may include a continuous sealing ring configured to form a water tight seal about the media port when the door is in the closed position. Additionally, in some embodiments, the deformable tab may form a portion of the sealing element.

In some example embodiments, the door assembly may include a retention plate configured to maintain the sealing element in contact with the door. The retention plate may be a ferrous material and the media port may include a magnet configured to apply a magnetic force to the retention plate, thereby biasing the door assembly to remain in the closed position. In some embodiments, the retention plate may be operably coupled to the door by one or more retention elements, such as a retention lip, projections and corresponding captures, adhesive, screws, or the like.

In an example embodiment, a door assembly for a marine electronics device is provided. The door assembly includes a door defining a first end and a second end. The door includes a substantially planar surface. The door assembly also includes at least one hinge element disposed proximate the first end and a finger recess disposed on a peripheral edge of the planar surface of the door at the second end. The finger recess is sized to enable a user to fit at least a portion of a finger therein to enable movement of the door to an open position with respect to the marine electronics device. The door assembly also includes a deformable tab disposed at the peripheral edge of the planar surface of the door at the second end. The deformable tab fills the finger recess of the door and is movable between a resting position and a deflected position. The deformable tab is biased to the resting position and movement of the deformable tab to the deflected position enables the user to move the door to the open position.

In some example embodiments, the door is configured to cover a media port of the marine electronics device when in the closed position.

In an example embodiment, the door assembly also includes a sealing element disposed in contact with the planar surface of the door. The sealing element includes a substantially planar surface and a continuous seal ring extending outward away from the planar surface of the sealing element. The continuous seal forms a water tight seal about the door when the door is in the closed position. In some example embodiments, the deformable tab is a portion of the sealing element. In an example embodiment, the door assembly also includes a retention plate configured to retain the planar surface of the sealing element in contact with the planar surface of the door.

In an example embodiment, the door is configured to cover a media port of the marine electronics device when in the closed position, the retention plate includes a ferrous metal, and the media port includes a magnet configured to apply a magnetic force to the retention plate such that the door assembly is biased to remain in the closed position.

In some example embodiments, the retention plate is operably coupled to the door by one or more retention elements.

In an example embodiment, the door also includes a peripheral wall disposed about and extending outward and away from at least a portion of the planar surface of the door and the one or more retention elements include one or more lips extending from the peripheral wall in a direction substantially parallel to the planar surface of the door.

In some example embodiments, the door or the retention plate also includes one or more capture apertures and the retention elements include one or more retention projections disposed opposite the capture apertures on the retention plate or the door such that the retention projections are captured by the capture apertures when the door is in the closed position.

In an example embodiment, the door or the sealing element also includes one or more alignment projections and the other of the door or the sealing element also includes one or more alignment receivers for receiving the alignment projections when the door is in alignment with the sealing element.

In some example embodiments, an exterior surface of the deformable tab is disposed flush with an exterior surface of the door, such that the deformable tab is deflected inward when the user applies pressure to the door to move the door to an open position.

In an example embodiment, an exterior surface of the deformable tab extends outward beyond an exterior surface of the door, such that the deformable tab deflects outward when the user applies pressure to the door to move the door to an open position.

In some example embodiments, the sealing element is comprised of silicone.

BRIEF DESCRIPTION OF THE DRAWINGS

Having thus described the invention in general terms, reference will now be made to the accompanying drawings, which are not necessarily drawn to scale, and wherein:

DETAILED DESCRIPTION

Exemplary embodiments of the present invention now will be described more fully hereinafter with reference to the accompanying drawings, in which some, but not all embodiments of the invention are shown. Indeed, the invention may be embodied in many different forms and should not be construed as limited to the exemplary embodiments set forth herein; rather, these embodiments are provided so that this disclosure will satisfy applicable legal requirements. Like reference numerals refer to like elements throughout.

Figure 1:
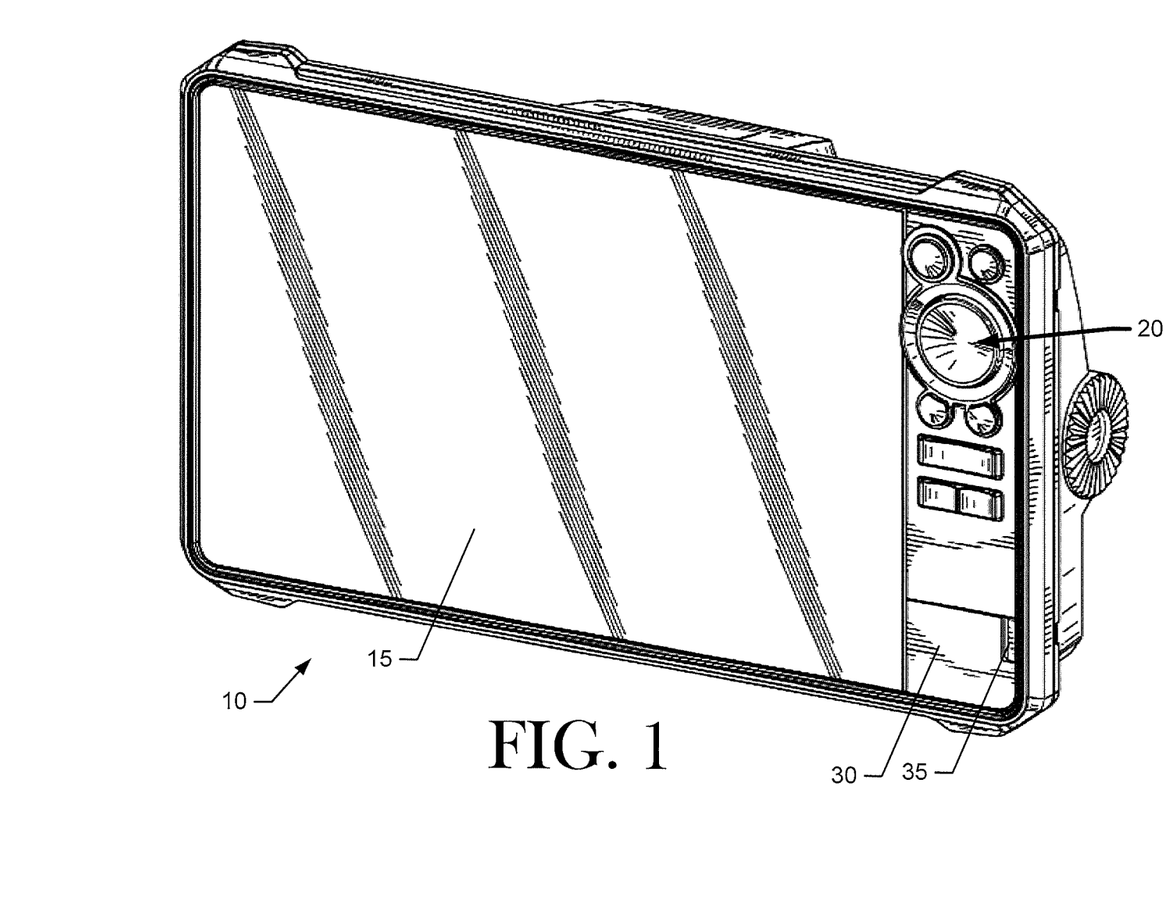
FIG. 1 illustrates an example perspective view of a marine electronics device including a media door assembly, in accordance with some example embodiments discussed herein.

FIG. 1 illustrates an example perspective view of a marine electronics device, e.g. multifunction display (MFD), 10 including a media door assembly 30. The MFD 10 may include a user interface which may include at least one display 15. The display 15, e.g. screen, may be configured to display images and may be configured to receive input from a user. The display 15 may be, for example, a conventional LCD (liquid crystal display), a touch screen display, or any other suitable display known in the art upon which images may be displayed. The user interface may also include one or more buttons 20 configured to receive user input by pressing or deflecting of the buttons 20. In some example embodiments, the user interface may include a media port (shown in FIG. 2), which is covered by a door assembly 30. The door assembly 30 may include a door with a finger recess configured to enable a user to fit a portion of their finger therein to enable movement of the door assembly 30 to an open position (shown in FIG. 2). The door assembly 30 may also include a deformable tab 35 disposed such that the deformable tab 35 fills the finger recess and provides water or debris resistance, when the deformable tab 35 is in a resting position. For example, the deformable tab 35 may limit entrance of water, such as a splash or a spray, or the like, and/or debris, such as dust, mud, or the like, into the media port, when the deformable tab 35 is in the resting position filling the finger recess. The deformable tab 35 may be moved, such as by a user's finger, to a deflected position to allow access to the finger recess for the user to manipulate to pull open the door. As such, the deformable tab 35 may be configured to deflect inward, outward, or both inward and outward.

Figure 2:
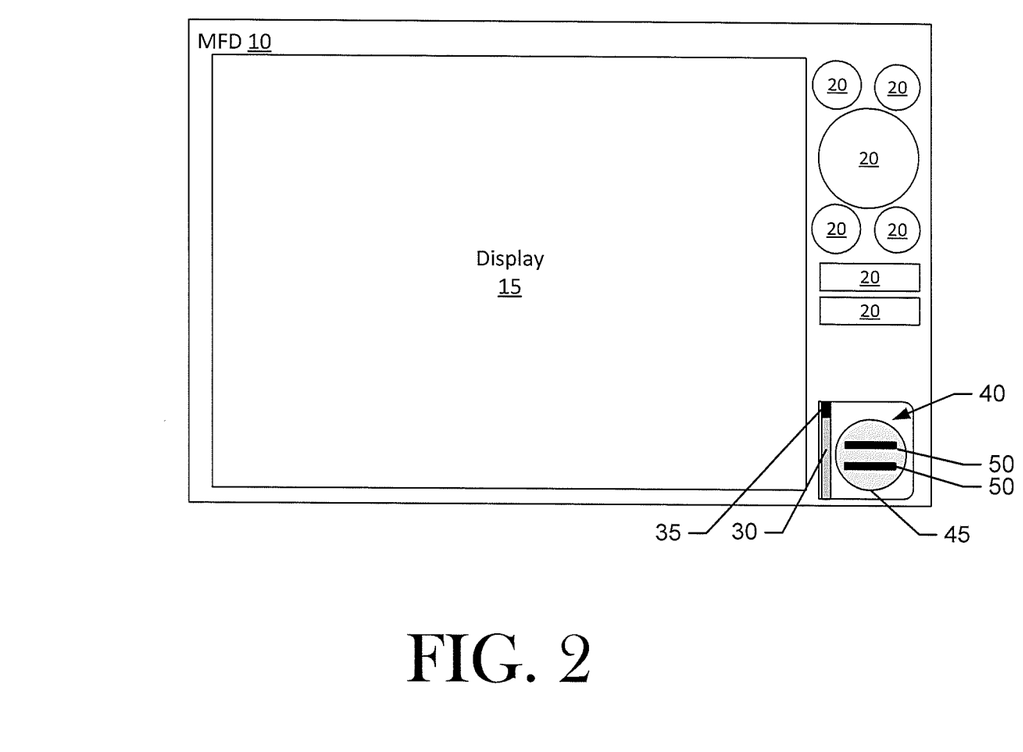
FIG. 2 illustrates an example schematic front view of a marine electronics device including a media door assembly in an open position, in accordance with some example embodiments discussed herein.

FIG. 2 depicts the MFD 10 with the door assembly 30 in an open position, allowing access to the media port 40. The media port 40 may include one or more media sockets 50 configured to receive a removable storage media, such as a USB flash drive, a SD card, micro SC card, or other media type. In some example embodiments, a mating surface 45 for a sealing element (shown in portions in FIGS. 3A-3C) of the door assembly 30 may be disposed around the media sockets 50. For example, the mating surface 45 may be a smooth ring enabling a tight seal and/or an area around the media sockets 50 that may be raised to create the mating surface 45.

Figures 3A, 3B:
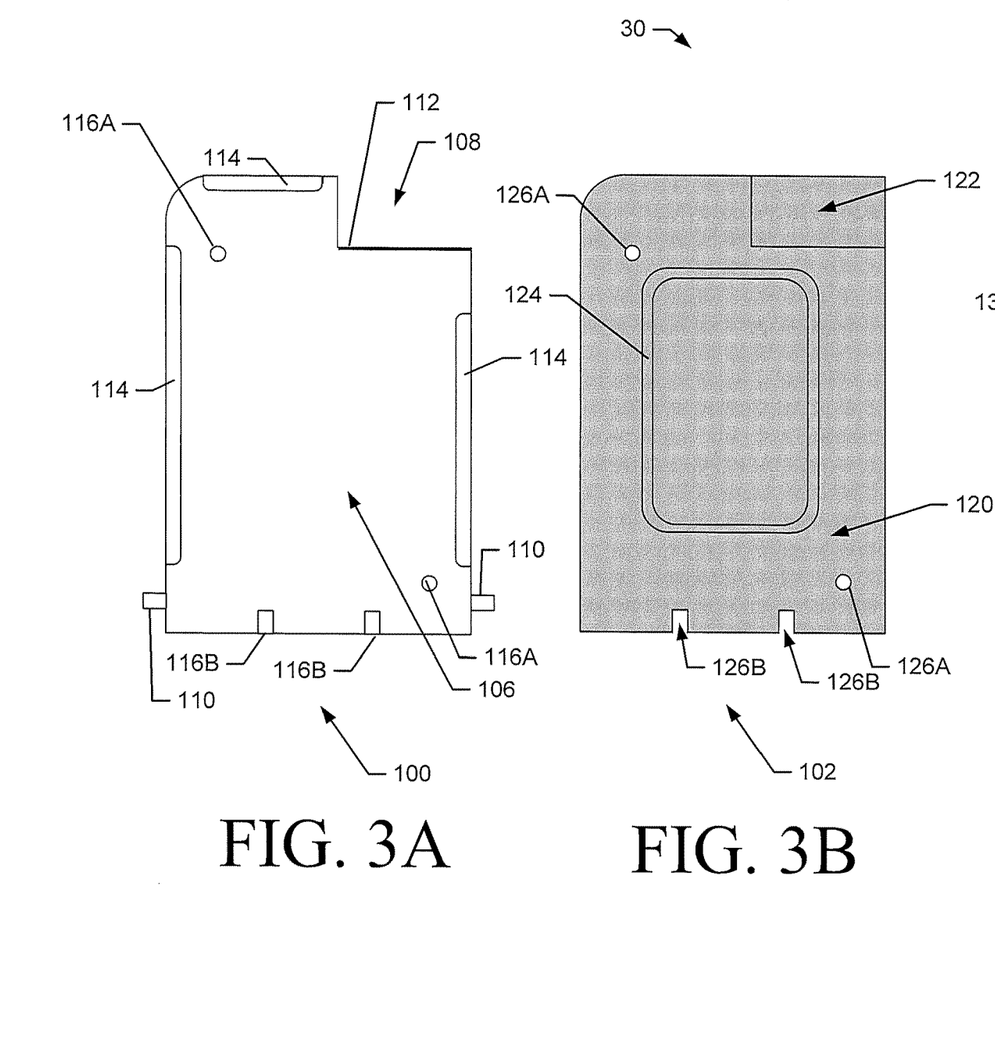
FIGS. 3A, 3B, and 3C illustrate example portions of a media door assembly in an exploded view, in accordance with some example embodiments discussed herein.
Figure 3C:
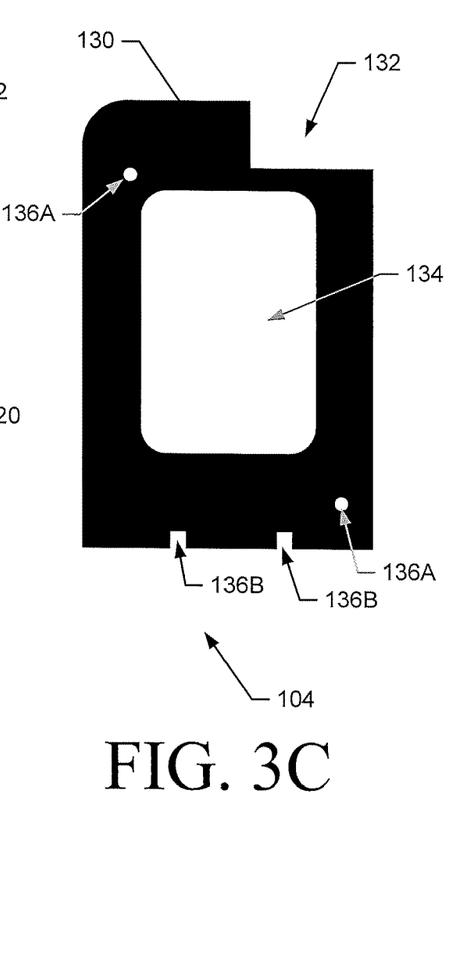
Figure 4:
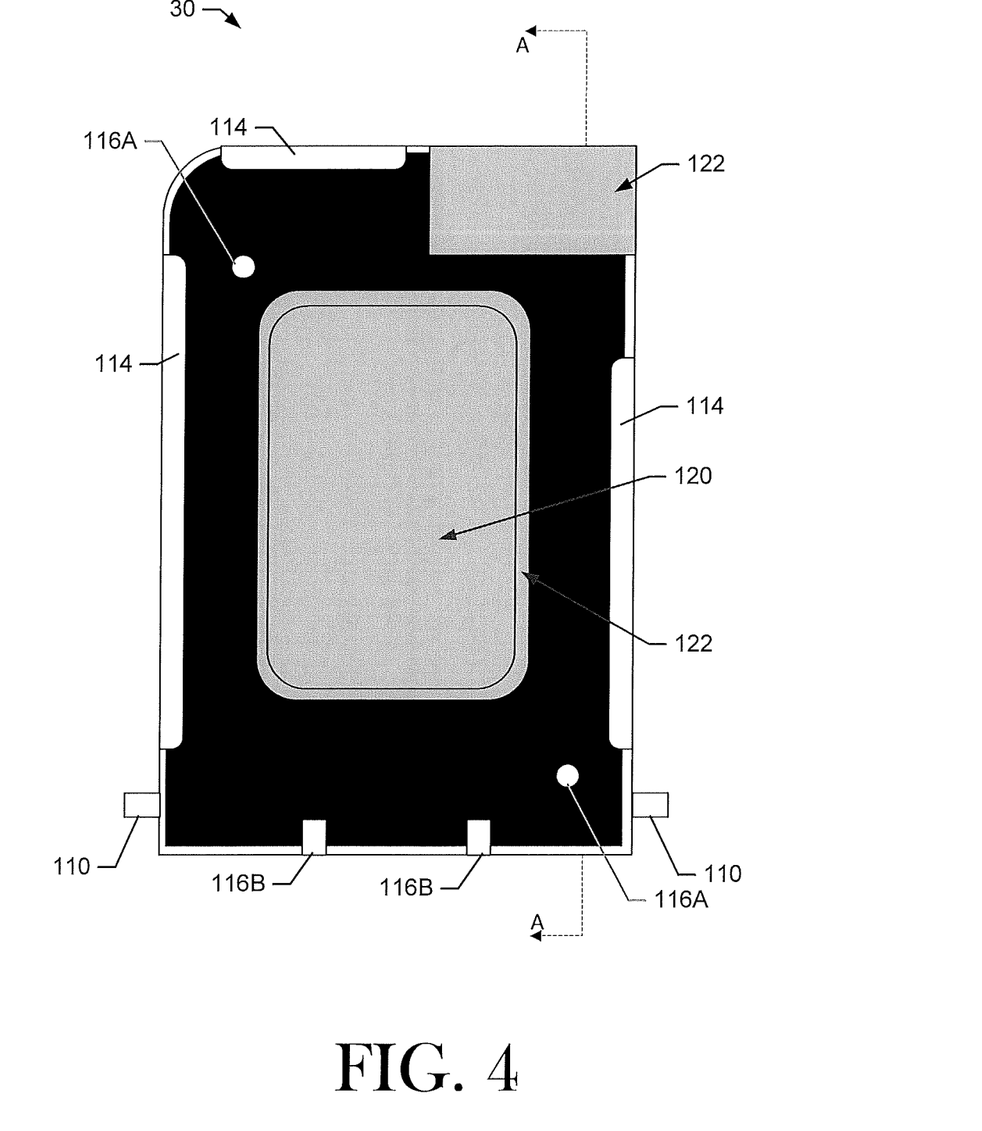
FIG. 4 illustrates an example assembled media door assembly, in accordance with some example embodiments discussed herein.

FIGS. 3A-3C together depict an exploded view of the door assembly 30 including a door 100, a sealing element 102, and a retention plate 104. FIG. 4 depicts the door assembly 30 of FIGS. 3A-3C after assembly.

The door 100 may include a substantially planar surface 106 including a finger recess 108, e.g. cutout, disposed on a peripheral edge 112 of the planar surface 106. The door 100 may include at least one hinge element 110 disposed at a first end of the door 100 and the finger recess 108 disposed at a second end opposite the at least one hinge element 110. The finger recess 108 may be sized to enable a user to fit at least a portion of a finger therein to enable a user to manipulate the door 100 to cause movement of the door to an open position, such as by pivoting on the one or more hinge elements 110. The hinge elements 110 may include posts, as depicted, configured to be received by corresponding apertures in the user interface of the MFD 10, or any other suitable hinge assembly.

Figure 5:
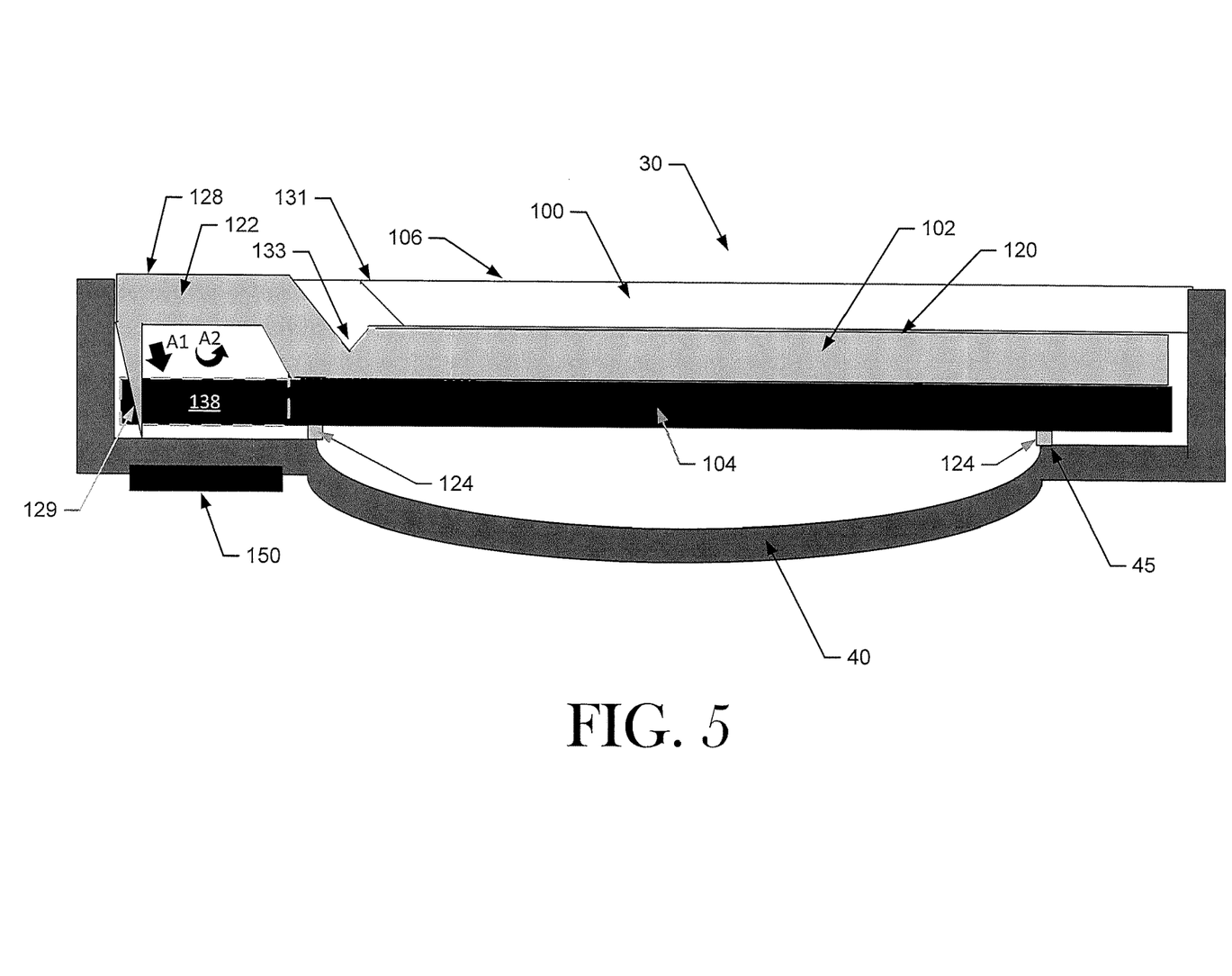
FIG. 5 illustrates an example cross-section of a media door assembly taken along line A-A in FIG. 4 disposed in a media port, in accordance with some embodiments discussed herein.

The sealing element 102 may include a substantially planar surface 120 configured to be disposed in contact with the planar surface 106 of the door 100. The sealing element 102 may include a deformable tab 122, which may be substantially similar to the deformable tab 35 discussed above in reference to FIGS. 1 and 2. The deformable tab 122 may be disposed at the peripheral edge of the planar surface 120 such that, when the sealing element 102 is in contact with the door 100, the deformable tab 122 fills the finger recess 108 of the door 100. Additionally, the sealing element 102 may include a continuous seal ring 124 extending outward away from the planar surface 120 of the sealing element 102. The continuous seal 124 forms a water tight seal about a port 40 (FIG. 1) when the door assembly 30 is in a closed position, by pressing against the mating surface 45 disposed around a recessed media port 40, such as depicted in FIG. 5.

The sealing element 102, the deformable tab 122, and/or the continuous seal 124 may be formed from a resilient material, which may be squeezed, deflected, or otherwise deformed and return to its original shape. For example, the sealing element 102, deformable tab 122, and/or the continuous seal 124 may be formed from rubber, silicone, or the like. Since the deformable tab 122 is formed from a resilient material, the deformable tab 122 may be biased to the resting position and movable between a resting position and a deflected position. In some embodiments, the deformable tab 122 may provide water or debris resistance when the door is in the closed position and the deformable tab 122 is in the resting position. Additionally, the deformable tab 122 is deflectable with respect to the door 100 and/or remainder of the sealing element 102 to enable the user to fit their finger partially under the door 100 to enable movement of the door assembly 30 to the open position.

In an example embodiment, the retention plate 104 may be configured to retain the planar surface 120 of the sealing element 102 in contact with the planar surface 106 of the door 100. In some embodiments, the retention plate 104 may be operably coupled to the door 100 by one or more retention elements. In some example embodiments, the door 100 includes a peripheral wall disposed about and extending outward and away from at least a portion of the planar surface 106 of the door 100. The one or more retention elements include one or more lips 114 extending from the peripheral wall in a direction substantially parallel to the planar surface 106 of the door 100. The one or more lips 114 may be configured to retain and compress the retention plate 104 and sealing element 102 against the planar surface 106 of the door 100, thereby sandwiching the sealing element 102 between the door 100 and the retention plate 104, such as depicted in FIG. 4.

Additionally or alternatively, the one or more retention elements may include one or more capture apertures 136A, 136B disposed on the door 100 and/or retention plate 104 and corresponding retention projections 116A, 116B disposed on the opposite of the door 100 or retention plate 104. The retention projections may be inserted into to the corresponding capture apertures. In the depicted example, the retention projections 116A are posts extending upward and away from the planar surface 106 of the door and are received and retained by the capture apertures 136A. Additionally, retention projections 116B include a bar and the corresponding retention apertures 136B include complementary slots. The retention projections may include a barb, lip, an enlarged cross-section at a distal end, or the like, such that the distal end of the retention projections may be inserted into the corresponding retention apertures, but will resist removal therefrom. In some example embodiments, the retention projections and retention apertures may, additionally or alternatively, serve as alignment projections and alignment receivers, respectively. The alignment projections and alignment receivers may cause the door 100 and retention plate 104 to be properly aligned when coupled. Similarly, the sealing element 102 may include one or more alignment apertures 126A, 126B that cooperate with retention elements 116A, 116B and retention apertures 136A, 136B, respectively, such that the sealing element 102 is also in proper alignment with the door 100 and the retention plate 104.

In an example embodiment, retention plate 104 may include a sealing aperture 134. The sealing aperture 134 may enable the continuous seal 124 to pass through the retention plate 104 and engage the mating surface 45 (FIG. 2), when the door assembly 30 is in the closed position.

FIG. 5 depicts a view of the assembled door assembly 30 of FIG. 4 at cross-section A-A and in the closed position with a corresponding media port 40. The deformable tab 122 may extend upward from the planar surface 120 of the sealing element 102 filling the finger recess 108 (FIG. 3A) providing water or debris resistance, as described above. In some example embodiments, an exterior surface 128 of the deformable tab is disposed substantially flush with an exterior surface of the door 100, as depicted, such that the deformable tab 122 is deflected inward, as depicted by arrow A1, when the user inserts the portion of a finger into the finger recess 108 to move the door 100 to an open position. Alternatively, the exterior surface 128 of the deformable tab 122 extends outward beyond an exterior surface of the door 100, such that the deformable tab 122 deflects outward when the user inserts the portion of a finger into the finger recess 108 to move the door 100 to an open position. In some embodiments, the deformable tab 122 may be configured to deform toward the peripheral wall of the door 100 and then deflect outward, as depicted by arrow A2. In some example embodiments, when the deformable tab 122 is deflected outward, the user may pull on the deformable tab 122, such as pinched by a thumb and finger, to move the door assembly 30 to the open position.

The deformable tab 122 may include a tab extension 129 extending toward the media port 40, when the door assembly 30 is in the closed position. The tab extension 129 may extend to touch the media port 40, e.g. the housing of the MFD 10. In the resting position, the tab extension 129 may act as a spring providing support for the deformable tab 122 such as to maintain, or bias, the deformable tab 122 into the finger recess (in some embodiments, the resilient nature of the material of the deformable tab may additionally or alternatively provide an inherent bias to return to the resting position). The tab extension 129 may collapse out of the way of the deformable tab 122 when the user inserts a finger into the finger recess, moving the deformable tab 122 to the deflected position.

In an example embodiment, the door 102 may include a reverse beveled edge, or "sharp" 131. The sharp may be disposed at a peripheral edge of the door 102 at the edge of the finger recess. The sharp 131 may provide increased grip for a finger inserted into the finger recess, when moving the door assembly 30 from the closed position to the open position. In an example embodiment, the deformable tab 122 may be configured to deflect inward, such that user's finger interacts directly with the sharp 131. In addition to the increase in grip, the sharp 131 may also enable greater finger access into the finger recess (e.g., there may be a greater volume for the finger to fit underneath the door once the deformable tab 122 is pressed).

In some example embodiments, the deformable tab 122 may include a hinge 133. The hinge 133 may include a reduction in material thickness disposed proximate to the peripheral edge of the door 30, at the edge of the finger recess. The hinge 133 may enable a pivot or bend point for the deformable tab 122. Additionally, the hinge 133 may reduce the amount of pressure necessary to move the deformable tab 122 from the resting position to the deflected position, which may produce a desirable tactile interaction with the door assembly 30.

Additionally or alternatively, the hinge 133 may be configured to interact with the sharp 131, such as when the deformable tab 122b is configured to deflect outward. In such an example configuration, the sharp 131 may enable a pivot or bend point for the deformable tab 122, similar to the hinge, discussed above. The hinge 133 may be disposed such that when the deformable tab 122 is moved to the deflected position (outward), the hinge 133 aligns with the sharp 131, thereby further reducing the pressure necessary to move the deformable tab 122 from the resting position to the deflected position.

In an example embodiment, door assembly 30 may include a door capture to maintain the door assembly 30 in a closed position when not in use. The retention plate 104 may include a ferrous material, such as a door capture element 138, or may be formed of a ferrous material. The media port 40 may include a magnet 150 configured to apply a magnetic force to the door capture element 138 and/or the retention plate 102, such that the door assembly 30 is biased to remain in the closed position. The magnet 150 may be molded into the media port 40, or may be positioned on a surface of the media port 40, such as the interior surface as depicted in FIG. 5.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the invention. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the invention. In this regard, for example, different combinations of elements and/or functions than those explicitly described above are also contemplated within the scope of the invention. Although specific terms are employed herein, they are used in a generic and descriptive sense only and not for purposes of limitation.

That which is claimed:

1. A door assembly for a marine electronics device, the door assembly comprising:
    a door defining a first end and a second end, the door comprising:
        a substantially planar surface;
        at least one hinge element disposed proximate the first end; and
        a finger recess disposed on a peripheral edge of the planar surface of the door at the second end, wherein the finger recess is sized to enable a user to fit at least a portion of a finger therein to enable movement of the door to an open position with respect to the marine electronics device; and
    a sealing element disposed in contact with the planar surface of the door, wherein the sealing element comprises;
        a substantially planar surface;
        a continuous seal ring extending outward away from the planar surface of the sealing element, wherein the continuous seal ring forms a water tight seal about the door when the door is in a closed position with respect to the marine electronics device, and
        a deformable tab disposed at the peripheral edge of the planar surface of the sealing element, wherein deformable tab extends outward from the planar surface of the sealing element and fills the finger recess of the door and is movable between a resting position and a deflected position, wherein the deformable tab is biased to the resting position, and wherein movement of the deformable tab to the deflected position enables the user to move the door to the open position.

2. The door assembly of claim 1 further comprising:
    a retention plate configured to retain the planar surface of the sealing element in contact with the planar surface of the door.

3. The door assembly of claim 2, wherein the door is configured to cover a media port of the marine electronics device when in the closed position, wherein the retention plate comprises a ferrous metal, and wherein the media port comprises a magnet configured to apply a magnetic force to the retention plate, such that the door assembly is biased toward the closed position.

4. A door assembly for a marine electronics device, the door assembly comprising:
    a door defining a first end and a second end, the door comprising:
        a substantially planar surface;
        at least one hinge element disposed proximate the first end; and
        a finger recess disposed on a peripheral edge of the planar surface of the door at the second end, wherein the finger recess is sized to enable a user to fit at least a portion of a finger therein to enable movement of the door to an open position with respect to the marine electronics device; and
    a deformable tab disposed at the peripheral edge of the planar surface of the door at the second end, wherein the deformable tab fills the finger recess of the door and is movable between a resting position and a deflected position, wherein the deformable tab is biased to the resting position, and wherein movement of the deformable tab to the deflected position enables the user to move the door to the open position.

5. The door assembly of claim 4, wherein the door is configured to cover a media port of the marine electronics device when in the closed position.

6. The door assembly of claim 4 further comprising:
    a sealing element disposed in contact with the planar surface of the door, wherein the sealing element comprises:
        a substantially planar surface; and
        a continuous seal ring extending outward away from the planar surface of the sealing element, wherein the continuous seal forms a water tight seal about the door when the door is in the closed position.

7. The door assembly of claim 6, wherein the deformable tab comprises a portion of the sealing element.

8. The door assembly of claim 7 further comprising:
    a retention plate configured to retain the planar surface of the sealing element in contact with the planar surface of the door.

9. The door assembly of claim 8, wherein the door is configured to cover a media port of the marine electronics device when in the closed position, wherein the retention plate comprises a ferrous metal, and wherein the media port comprises a magnet configured to apply a magnetic force to the retention plate such that the door assembly is biased to remain in the closed position.

10. The door assembly of claim 8, wherein the retention plate is operably coupled to the door by one or more retention elements.

11. The door assembly of claim 10, wherein the door further comprises a peripheral wall disposed about and extending outward and away from at least a portion of the planar surface of the door, and wherein the one or more retention elements comprise one or more lips extending from the peripheral wall in a direction substantially parallel to the planar surface of the door.

12. The door assembly of claim 10, wherein the door or the retention plate further comprises one or more capture apertures, and wherein the retention elements comprise one or more retention projections disposed opposite the capture apertures on the retention plate or the door such that the retention projections are captured by the capture apertures when the door is in the closed position.

13. The door assembly of claim 6, wherein the door or the sealing element further comprise one or more alignment projections and the other of the door or the sealing element further comprises one or more alignment receivers for receiving the alignment projections when the door is in alignment with the sealing element.

14. The door assembly of claim 4, wherein an exterior surface of the deformable tab is disposed flush with an exterior surface of the door, such that the deformable tab is deflected inward when the user applies pressure to the door to move the door to an open position.

15. The door assembly of claim 4, wherein an exterior surface of the deformable tab extends outward beyond an exterior surface of the door, such that the deformable tab deflects outward when the user applies pressure to the door to move the door to an open position.

16. The door assembly of claim 4, wherein the sealing element is comprised of silicone.

17. A marine electronics device comprising;
a housing;
a media port disposed in the housing configured to receive one or more types of electronic media; and
a door assembly configured to provide a water tight seal about the media port when the door assembly is in a closed position with respect to the marine electronics device, wherein the door assembly comprises:
a door defining a first end and a second end, the door comprising:
a substantially planar surface;
at least one hinge element disposed proximate the first end; and
a finger recess disposed on a peripheral edge of the planar surface of the door at the second end, wherein the finger recess is sized to enable a user to fit at least a portion of a finger therein to enable movement of the door to an open position with respect to the marine electronics device; and
a deformable tab disposed at the peripheral edge of the planar surface of the door at the second end, wherein the deformable tab fills the finger recess of the door and is movable between a resting position and a deflected position, wherein the deformable tab is biased to the resting position, and wherein movement of the deformable tab to the deflected position enables the user to move the door to the open position.

18. The marine electronics device of claim 17 further comprising:
a sealing element disposed in contact with the planar surface of the door, wherein the sealing element, wherein the deformable tab comprises a portion of the sealing element; and
a retention plate configured to retain the planar surface of the sealing element in contact with the planar surface of the door.

19. The marine electronics device of claim 18, wherein the retention plate comprises a ferrous metal, and wherein the media port comprises a magnet configured to apply a magnetic force to the retention plate such that the door assembly is biased to remain in the closed position.

20. The marine electronics device of claim 18, wherein the retention plate is operably coupled to the door by one or more retention elements.

* * * * *